US006951456B2

(12) United States Patent
Cohen et al.

(10) Patent No.: US 6,951,456 B2
(45) Date of Patent: Oct. 4, 2005

(54) MICROCOMBUSTOR AND COMBUSTION-BASED THERMOELECTRIC MICROGENERATOR

(75) Inventors: Adam L. Cohen, Los Angeles, CA (US); Paul D. Ronney, Monrovia, CA (US); Uri Frodis, Los Angeles, CA (US); Lars Sitzki, Niedernhausen (DE); Eckart H. Meiburg, Santa Barbara, CA (US); Steffen Wussow, Hamburg (DE)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 10/630,513

(22) Filed: Jul. 29, 2003

(65) Prior Publication Data

US 2005/0072454 A1 Apr. 7, 2005

Related U.S. Application Data

(63) Continuation of application No. 09/755,985, filed on Jan. 5, 2001, now Pat. No. 6,613,972.
(60) Provisional application No. 60/175,154, filed on Jan. 7, 2000.

(51) Int. Cl.[7] ............................................. F23D 14/02
(52) U.S. Cl. ...................... 431/215; 136/209; 136/204; 136/211; 136/212; 431/116; 431/242; 431/247; 431/254; 431/258; 431/350; 110/204
(58) Field of Search ................................. 136/209, 204, 136/211, 212; 431/215, 116, 242, 247, 254, 258, 350; 110/204

(56) References Cited

U.S. PATENT DOCUMENTS

| | | | | |
|---|---|---|---|---|
| 2,792,200 A | * | 5/1957 | Huggins et al. ............. | 165/149 |
| 3,525,325 A | * | 8/1970 | Perl ........................... | 126/39 J |
| 3,646,927 A | * | 3/1972 | Perl ........................... | 126/39 J |
| 3,858,646 A | * | 1/1975 | Naylor ........................ | 165/145 |
| 3,899,359 A | * | 8/1975 | Stachurski ................... | 136/205 |
| 4,382,425 A | * | 5/1983 | Boyes ........................ | 122/367.1 |
| 4,860,695 A | * | 8/1989 | Korenberg ................. | 122/136 R |
| 4,879,959 A | * | 11/1989 | Korenberg ................. | 110/264 |
| 6,282,371 B1 | * | 8/2001 | Martin et al. ............... | 392/490 |
| 6,613,972 B2 | * | 9/2003 | Cohen et al. ................ | 136/209 |
| 6,786,716 B1 | * | 9/2004 | Gardner et al. ............. | 431/268 |
| 6,840,762 B2 | * | 1/2005 | Maruta et al. ............... | 431/328 |
| 2003/0121791 A1 | * | 7/2003 | Cohen ........................ | 205/93 |
| 2003/0127336 A1 | * | 7/2003 | Cohen et al. ................ | 205/93 |
| 2003/0183008 A1 | * | 10/2003 | Bang et al. ............... | 73/514.01 |
| 2003/0221968 A1 | * | 12/2003 | Cohen et al. ............... | 205/118 |
| 2003/0222738 A1 | * | 12/2003 | Brown et al. ............... | 333/206 |

FOREIGN PATENT DOCUMENTS

JP          2-272214 A      * 11/1990

OTHER PUBLICATIONS

Sitzki et al, "Combustion in Microscale Heat–Recirculating Burners," The Third Asia–Pacific conference on Combustion, Jun. 24–27, 2001, Seoul, Korea.*

Maruta et al, "Catalytic Combustion in Microchannel for MEMS Power Generation," The Third Asia–Pacific conference on Combustion, Jun. 24–27, 2001, Seoul, Korea.*

* cited by examiner

*Primary Examiner*—Alan Diamond
(74) *Attorney, Agent, or Firm*—Dennis R. Smalley

(57) ABSTRACT

A generally toroidal counterflow heat exchanger is the main element of a combustor that operates at a micro scale. The combustor includes a central combustion region with openings to a reactant gas channel and an exhaust gas channel. The reactant channel and exhaust channels are coiled around each other in a spiral configuration that reduces heat loss. An electric current microgenerator is similar and also includes a thermoelectric active wall composed of n-type and p-type thermoelectric elements as part of a channel wall of the microcombustor. The thermoelectric active wall includes fins configured to increase the temperature differential across the thermoelectric elements relative to the temperature difference between the thermoelectric elements and the reactant and exhaust gases. A method of monolithically fabricating such microdevices by electrodepositing multiple layers of material is also provided.

3 Claims, 14 Drawing Sheets

FIG 14A  FIG 14B

MICROCOMBUSTOR AND COMBUSTION-BASED THERMOELECTRIC MICROGENERATOR

RELATED APPLICATION

This application is a continuation of U.S. patent application Ser. No. 09/755,985, filed on Jan. 5, 2001 now U.S. Pat. No. 6,613,972, which in turn claims priority from U.S. Provisional Application Ser. No. 60/175,154, filed Jan. 7, 2000, These applications are hereby incorporated herein by reference as if set forth in full.

GOVERNMENT LICENSE RIGHTS

The U.S. Government has a paid-up license in this invention and the right in limited circumstances to require the patent owner to license others on reasonable terms as provided for by the terms of Grant No. DABT63-99-C-0042 awarded by DARPA.

FIELD OF THE INVENTION

This invention relates generally to apparatus for generation of electrical power at a very small scale and, in particular, to thermoelectric generators based on counterflow heat exchanger combustors.

BACKGROUND

It is well known that use of combustion processes for electrical power generation provides enormous advantages over batteries in terms of energy storage per unit mass and in terms of power generation per unit volume, even when the conversion efficiency in the combustion process from thermal energy to electrical energy is taken into account. For example, hydrocarbon fuels provide an energy storage density between 40 and 50 MJ/kg, whereas even modem lithium ion batteries provide only 0.4 MJ/kg. Thus, even at 5% conversion efficiency from thermal to electrical energy, hydrocarbon fuels provide 5 times higher energy storage density than batteries. Also, the waste products are primarily carbon dioxide and water as compared to toxic metals in the case of batteries. Furthermore, the power generation rate per unit mass or volume of combustion device is orders of magnitude larger than other technologies using chemical reactions, for example, fuel cells. Also, hydrocarbon fuels are relatively inexpensive, readily available, easily stored, and have much longer shelf lives than batteries. Furthermore, combustion-driven devices can use a variety of conventional hydrocarbon fuels without any pre-processing.

Despite these advantages, combustion processes for converting fuel energy to electrical energy have not yet proved practical for powering small scale devices such as cell phones and other portable electronics, which currently rely on batteries. Most approaches to combustion at a small scale use scaled-down versions of macroscopic combustion engines, for example, micro-scale rotary (Wankel) engines, free-piston engines, and micro gas turbine engines. However, when applied at a micro scale, these approaches have numerous difficulties. One of the most fundamental problems limiting combustion at a micro scale is flame quenching due to heat losses when the dimensions of the combustion chamber are too small. For stoichiometric hydrocarbon-air mixtures at atmospheric pressure, the minimum combustion chamber dimension in which flames can exist is about 2 mm when chamber walls are at atmospheric pressure. Furthermore, even if flame quenching does not occur, heat and friction losses become increasingly important at smaller scales since the heat release due to combustion and thus power output scales with engine volume whereas heat and friction losses scale with surface area.

Thus, there remains a need for an efficient microscale combustor that will enable combustion processes to be used for the generation of electrical power for small-scale low-power systems such as micro-electro-mechanical-systems (MEMS) devices, and portable electronic devices such as personal organizers, laptop computers, and wireless phones.

SUMMARY

A generally toroidal counterflow heat exchanger forms the basis of a combustor that operates at a micro scale. An electrical microgenerator is similar and also includes a thermoelectric active wall composed of thermoelectric elements as part of a channel wall of the microcombustor. The heat exchanger is configured such that in a cross section parallel to an axis of rotation of the toroid surface, there is a central combustion region with openings to a reactant gas channel and an exhaust gas channel. The reactant channel and exhaust channel are coiled around each other and separated by a channel wall such that when the generator is operating, one surface of the channel wall in the interior of the heat exchanger is in contact with reactant gas and the other surface is in contact with exhaust gas. The counterflow arrangement reduces heat loss from the combustor and pre-heats the reactant gases. The microcombustor may have applications other than generating electrical current where very small amounts of heat are needed.

The microcombustor and microgenerator have an outer diameter of the toroid that is between about 2 and about 15 mm. Their height is between about 1 and about 6 mm. The central combustion region has a characteristic dimension less than about 1 mm.

The microgenerator includes a reactant gas inlet on the exterior of the heat exchanger in communication with the reactant gas channel and an exhaust gas port on the exterior of the heat exchanger in communication with the exhaust gas channel. An ignitor may be included within the heat exchanger. The thermoelectric material is electrically connected to the exterior of the microgenerator. The structural material of which the microgenerator is composed is a conductive metal. Electrodeposited platinum is a useful structural material. In some arrangements the structural material of the microgenerator provides the electrical connection between the thermoelectric elements and the exterior of the microgenerator.

The thermoelectric active wall consists of elements of n-type conductivity thermoelectric material and of p-type conductivity thermoelectric material and fins composed of thermally and electrically conductive material. The fins are configured to increase the temperature differential across the thermoelectric elements relative to the temperature difference between the thermoelectric elements and the reactant and exhaust gases. The fins may be T-shaped having a base portion and a top portion and arranged such that each base portion separates an n-type element and p-type element and the top portions extend into the reactant channel and into the exhaust channel. According to an aspect of the present invention the top portion of the fins is at least three times longer than the base portion of the fins. The invention additionally includes L-shaped fins and asymmetric T-shaped fins.

The microgenerator may include a partition wall juxtaposed between partial toroidal portions of the heat exchanger. In some arrangements an igniter within the heat exchanger includes resistive elements or sparking elements which are connected to an external power source, optionally through conductors in the partition wall.

According to another aspect of the present invention, a method of fabricating a thermoelectric microgenerator or microcombustor based on electrodeposition of multiple layers of material is provided. The method includes electrochemically depositing a sacrificial material using a mask comprising an elastomer affixed to an electrode, electrochemically depositing a structural material using a mask comprising an elastomer affixed to a support and a separate electrode, and blanket electrodepositing a thermoelectric material without use of a mask. After all layers have been deposited, the structural material is removed to form the generator. Alternatively, the order in which the structural material and the thermoelectric material are deposited can be reversed. In another alternative process, each deposition of thermoelectric material is preceded by deposition of a thin barrier layer to overcome any incompatibility between the sacrificial material and the thermoelectric material. The invention also includes an anodeless mask for selectively electrodepositing material, the mask comprising a patterned elastomer affixed to a perforated non-electrode support composed of non-porous material.

BRIEF DESCRIPTION OF THE DRAWINGS

FIG. 4b is a schematic wiring diagram of the generator of FIG. 4a.

FIGS. 14a–14c illustrate part of the process of fabricating a generator including a barrier layer in the thermoelectric elements according to an embodiment of the present invention.

DETAILED DESCRIPTION

A "toroidal" counterflow heat exchanger enables combustion of fuel air mixtures at a micro scale. By including thermoelectric power generating elements as part or all of the heat exchanger walls, a microgenerator device is obtained. The micro scale devices are formed by a three-dimensional microfabrication technique in a monolithic process.

Figure 1A:
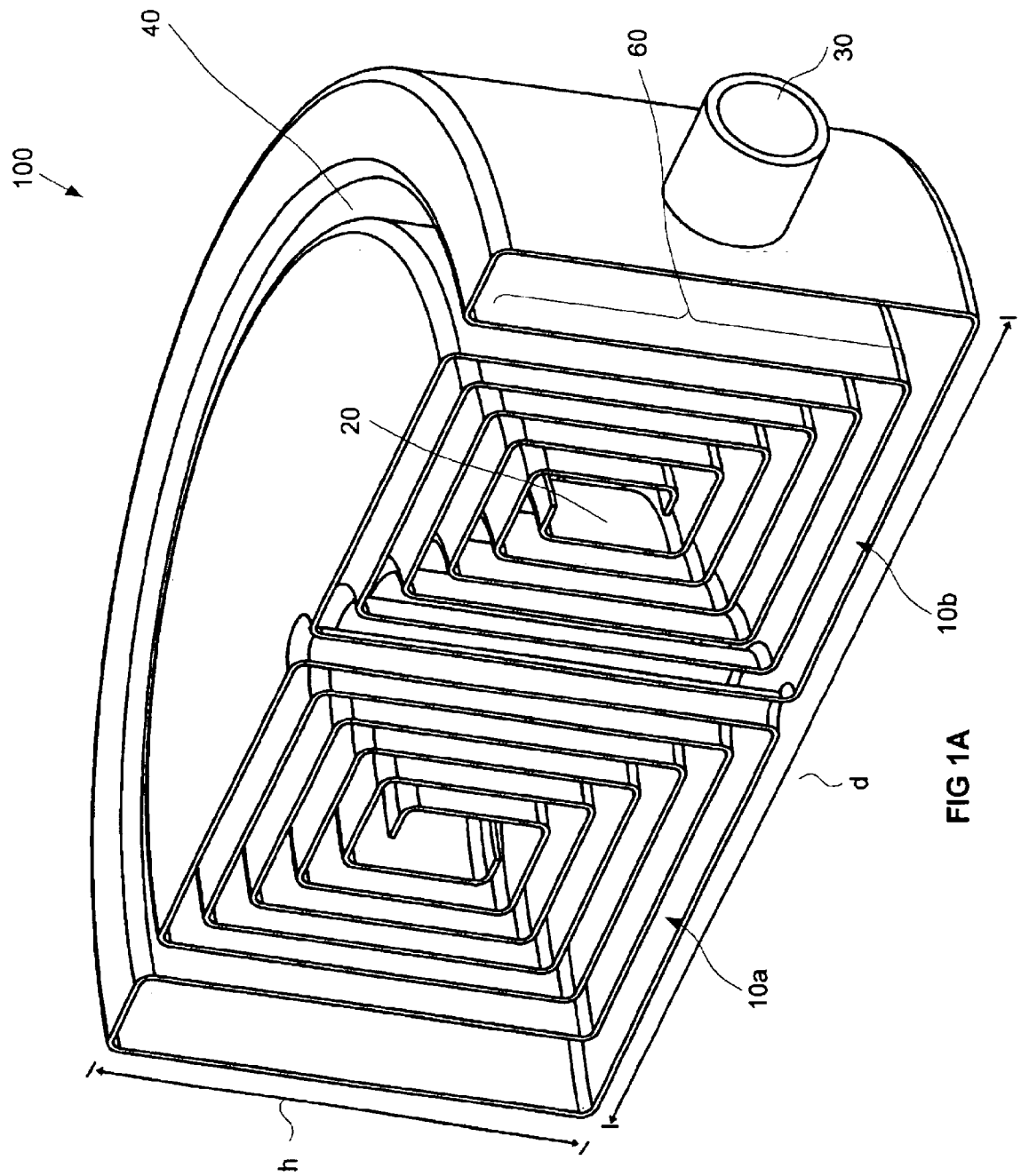
FIG. 1a is a cutaway view of a toroidal combustor according to an embodiment of the present invention.
Figure 1B:
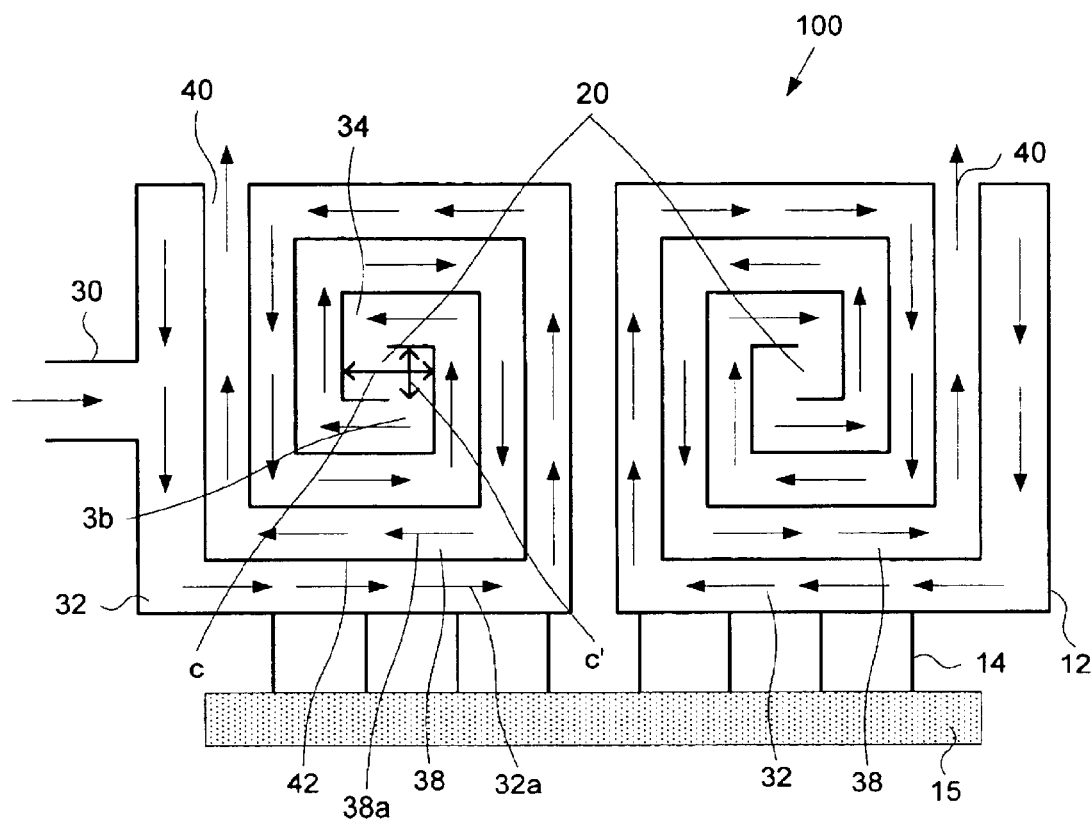
FIG. 1b is a cross sectional view of the combustor through a plane parallel to the axis of rotation of the toroid.

A cut away view of toroidal combustor 100 is shown in FIG. 1a and the exposed cross section of FIG. 1a is illustrated in greater detail in FIG. 1b. The topology of combustor 100 is referred to as a toroid, using the term quite generally. A toroid, popularly described as donut-shaped, is formally defined as a surface generated by a plane closed curve rotated about a line that lies in the same plane as the curve but does not intersect it. Thus, the cross section of combustor 100 through a plane parallel to the axis of rotation is composed of two portions 10a and 10b that are essentially mirror images of each other. While combustor 100 is pictured in FIGS. 1a and 1b as having cylindrical symmetry, that is in a top down view combustor 100 appears to be circular, such symmetry and shape are not required. For example, outside walls 12 of combustor 100 need not be round, but may have facets. Thus, the combustor may alternatively take a variety of closed shapes in top down view including an oval or a closed polygon, such as a triangle, square, or hexagon. The choice of outside shape may be dictated by fabrication considerations. The combustor is preferably formed of an electrodeposited metal as described in detail below. The walls of the combustor, therefore, are electrically conducting.

Combustor 100 includes a central region 20, which typically serves as the combustion region. Reactant gases enter combustor 100 through reactant gas port 30 and flow through spiral reactant channel 32, entering combustion region 20 through opening 34. Exhaust gases exit combustion region 20 through opening 36 and flow through spiral exhaust channel 38 to exhaust port 40. In the double spiral, or so-called "Swiss roll" configuration of combustor 100, each internal channel wall, such as channel wall 42 is in contact with cool reactant gases flowing in one direction, shown as direction 32a, on one side and with hot exhaust gases, flowing in the opposite direction, 38a, on the other side. The spiral counterflow heat-exchanger arrangement of combustor 100 greatly reduces heat losses to ambient atmosphere that pose a severe limitation to microcombustion devices with straight channels. Further, in the toroidal topology, there are no exposed channel ends, which would be a site of heat loss in other geometries. The configuration allows a supporting substrate 15, as shown in FIG. 1b, which is only in contact with the outermost turn, to remain cool enough to avoid being damaged by combustion temperatures. The device may optionally include thermal isolation stilts 14 to further insulate it from its surroundings. Alternative thermal isolation approaches include a slab of low thermal conductivity material such as an aerogel in place of thermal isolation stilts 14.

Figure 6:
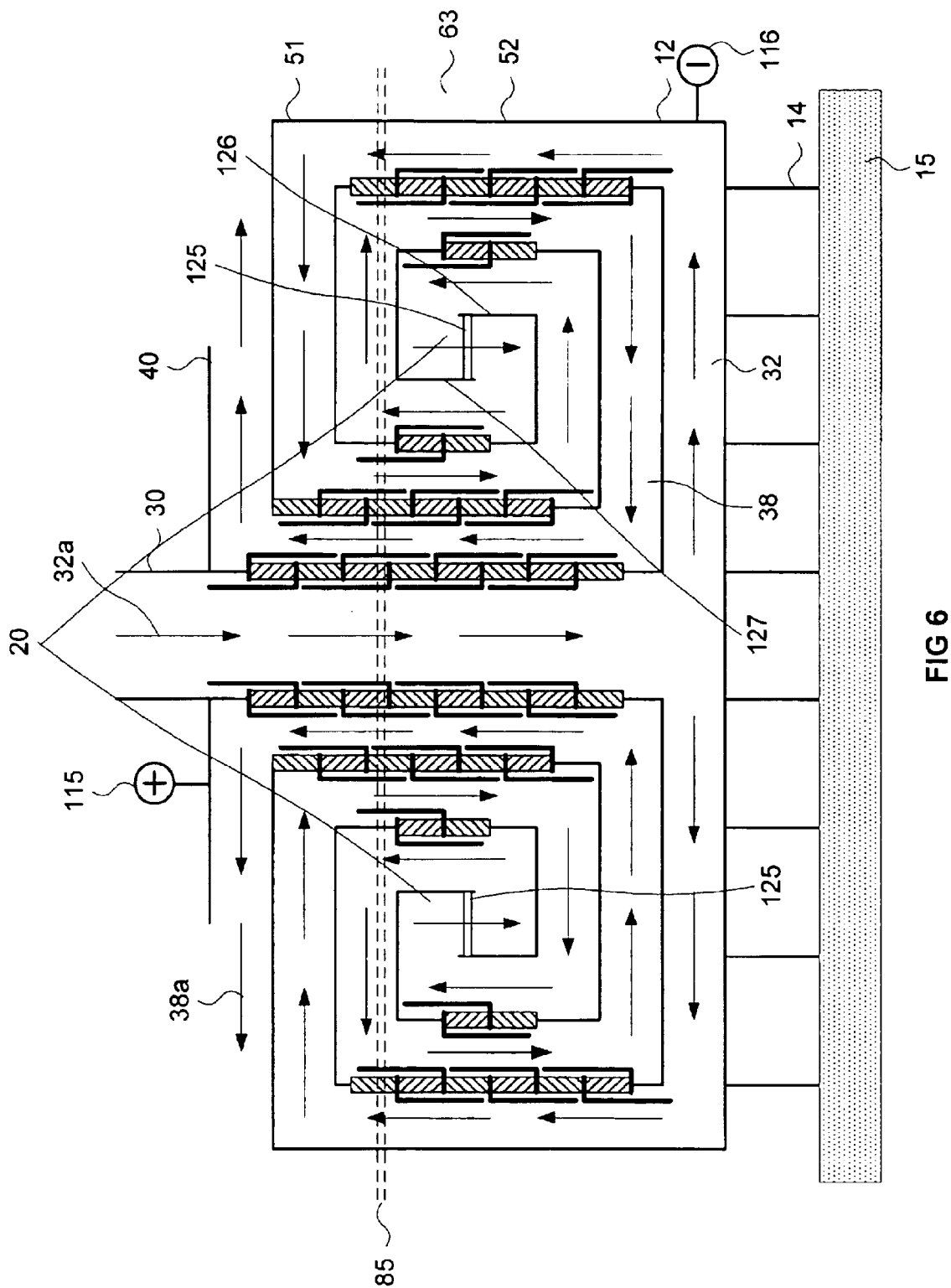

While a single reactant gas port 30 is illustrated here, combustor 100 could alternatively have multiple reactant gas ports spaced around the outside of the combustor. The number of "windings" of the reactant channel and exhaust channel may vary. Furthermore, by varying the number of windings and placement of the channels, alternative arrangements of the reactant ports and exhaust ports can be used. For one alternative example, a central reactant port can be surrounded by a concentric exhaust port, as illustrated in FIG. 6 below.

Exemplary dimensions of combustor 100 are outside diameter d between about 2 and 15 mm and height h between about 1 and 6 mm. The combustion region 20 has a characteristic dimension c or c' in FIG. 1b that is less than about 1 mm while the width of reaction channel 32 and exhaust channel 38 ranges between about 100 μm and about 1 mm. The combustion chamber dimensions are typically larger than the width of the reaction or exhaust channels. Combustor 100 is referred to, therefore, as a microcombustor to emphasize its micro scale. The small scale of the channels dictates the operating conditions of the microcombustor correspond to a low Reynolds number, the dimensionless parameter characterizing fluid flow, of between about 5 and 50, which indicates a condition of laminar flow.

Figure 2:
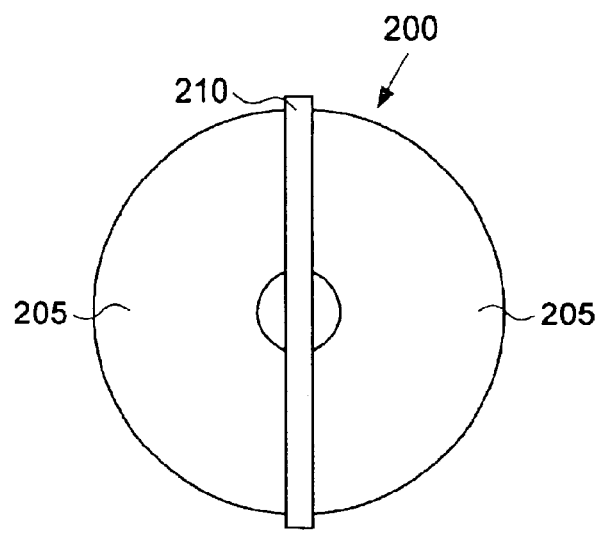
FIG. 2 is a top view of a combustor according to an embodiment of the present invention.

In one embodiment, a microcombustor is built as two similar or identical half toroids 205, each of which is similar to the cutaway portion shown in FIG. 1a. The portions are assembled together with an optional partition wall 210 between the two halves as shown in the top view of combustor 200 in FIG. 2. The partition is constructed primarily from a thermally and electrically insulating material. Using an insulating partition, the two halves can be electrically independent and do not need to be perfectly aligned with each other. Heat losses are minimized in the configuration of combustor 200 much as in a full 360-degree toroidal configuration since the two halves keep each other warm. While a single partition wall is pictured in FIG. 2, the combustor could alternatively consist of multiple partial toroidal segments joined by multiple partition walls. As used herein, a generally toroidal structure includes structures having partial toroidal segments juxtaposed to a partition wall as shown, for example, in FIG. 2.

Multiple approaches to igniting combustion can be used with the present microcombustors. First, the combustors may be heated externally, for example by wrapping them in electric heaters, to ignite combustion. Second, a thin wire of, e.g., the structural material of which the combustor is constructed can be provided joining the walls of the combustion region. The thin wire is electrically connected to an external power source, through the conductive walls of the combustor, and resistively heated to ignite combustion.

Figure 3:
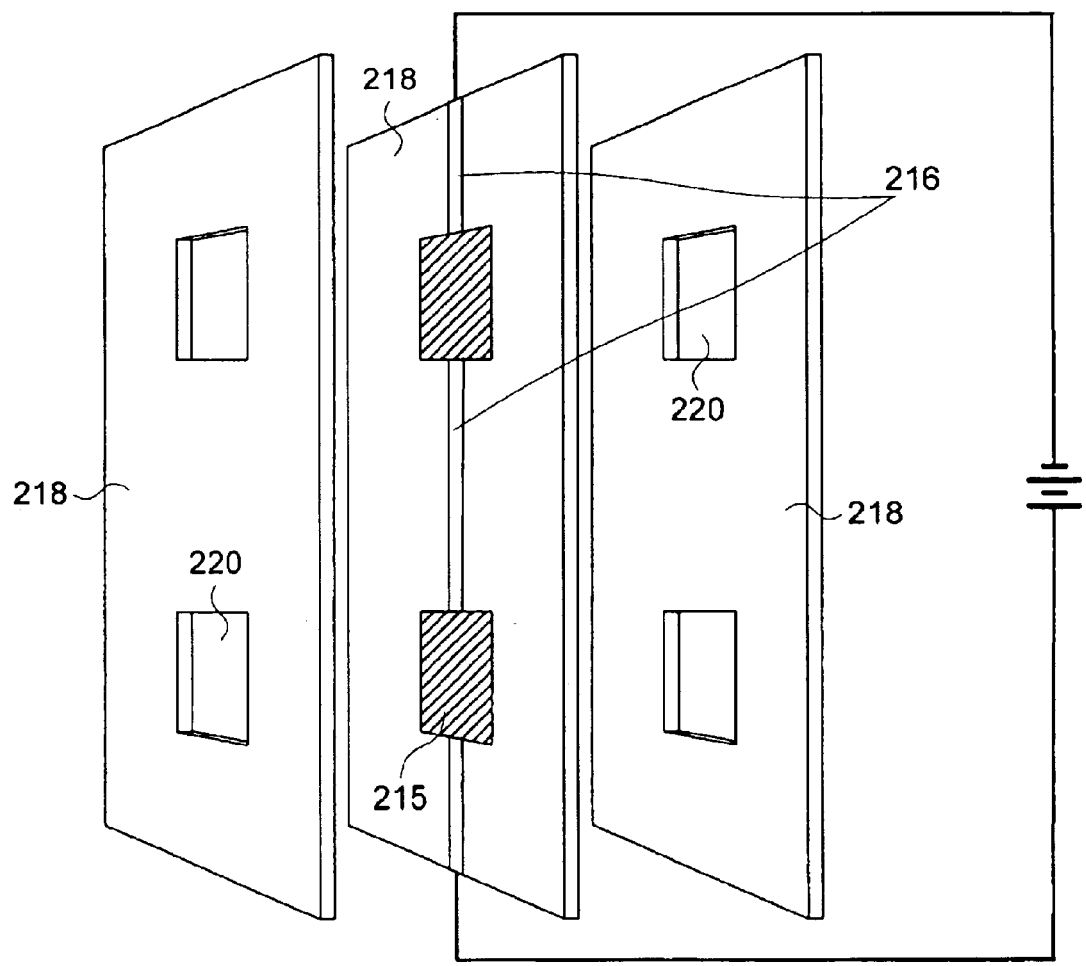
FIG. 3 is a partition wall included in a combustor as in FIG. 2 according to an embodiment of the present invention.

When the combustor includes a partition wall, as in combustor 200, the partition wall itself may be used to facilitate ignition. In one embodiment, resistive elements 215 and electrical leads 216 connected to them are sandwiched between electrically insulating material 218 comprising a portion of the partition wall 210, as shown in FIG. 3. The electrically insulating material has openings 220 aligned with the combustion regions 20 exposing the combustion region to the resistive elements. In another approach, the resistive elements can include projections on either side, commonly termed glow-plugs, that extend partway into the toroidal combustion volume to facilitate ignition. Alternatively, spark plug-like devices could extend into the combustion region to cause ignition. In further alternatives, spark plugs need not be limited to the partition wall, but may be distributed around the combustion chamber.

Figure 4A:
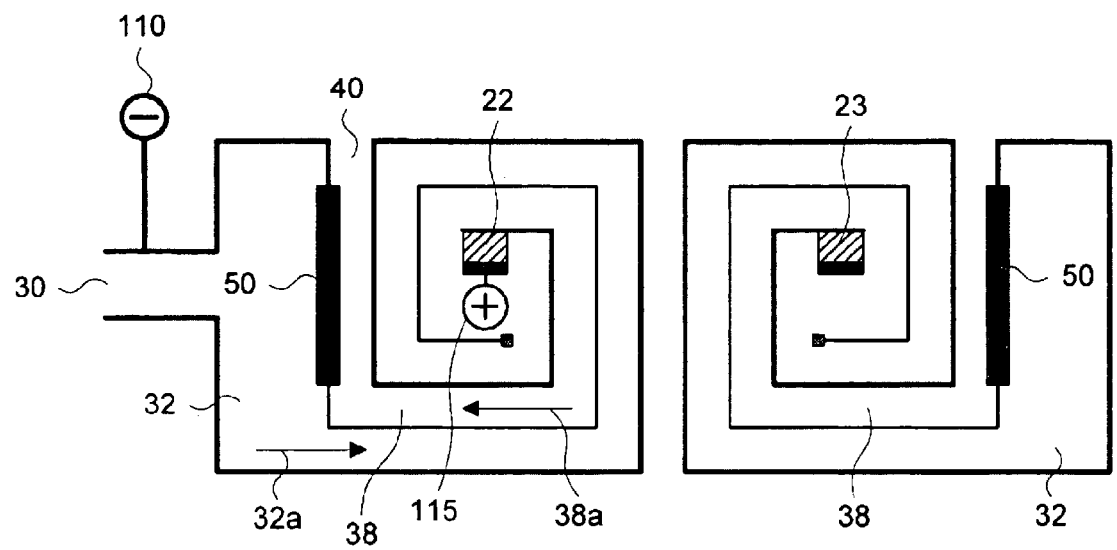
FIG. 4a is a cross section of a generator including an annular ignitor according to an embodiment of the present invention.

FIG. 4a illustrates in a cross sectional view similar to that of FIG. 1b yet another alternative approach for igniting combustion. A highly resistive material, for example nickel-chromium, is formed in a semiannular form, shown in cross section 22, in FIG. 4a. Preferably, the entire top surface of resistive material 22 contacts the conductive structural metal of the combustor, which provides a return path for ignition current. The opposite surface of the resistive material is coated with a thin layer of structural or other high-conductivity metal 23, which makes contact with a conductor located in the partition wall through which external current can be applied. Alternatively, the opposite surface of the resistive material can make contact with an electrically isolated portion of the toroidal combustor, with the external current applied through the combustor itself. Using the half ring of resistive material, the entire half-toroidal combustion volume can be heated to cause ignition.

Commercially available hydrocarbon fuels can be used with the present microcombustor. Fuels that are liquids at fairly low storage pressure and room temperature, but are gaseous at atmospheric pressure and room temperature are preferred such that no vaporization is required. Examples of useful hydrocarbon fuels include but are not limited to butane, propane, and methylacetylene. In addition, specially formulated hydrocarbon fuels or non-hydrocarbon fuels such as hydrogen and ammonia can be used. The heat recirculating combustion design makes it possible to use reactant mixtures that are not flammable outside the combustor, for example butane diluted with carbon dioxide. Using reactive mixtures that are not flammable in air provides a failsafe mechanism in the event of leakage of unburned reactants from the combustor.

In typical applications, the microcombustor is equipped with a miniature fuel tank, which can be filled from a larger tank through a conventional valve, of the type used, for example, in cigarette lighters. Typically, the oxidant for combustion is air, although other oxidants, for example oxygen and oxygen-air mixtures could alternatively be used. For a fuel stored under pressure, unpressurized air is entrained by the flow momentum of gaseous fuel escaping the fuel tank, such that the storage pressure of the fuel is sufficient to provide the required gas flow through the microcombustor. In this arrangement, fuel and oxidant are typically well mixed by diffusion alone by the time the two reactants reach the combustion chamber. Alternatively, specially-designed structures, such as fuel injection nozzles can be used to increase mixing. In another alternative, fuel and oxidant can be injected separately.

Figure 5:
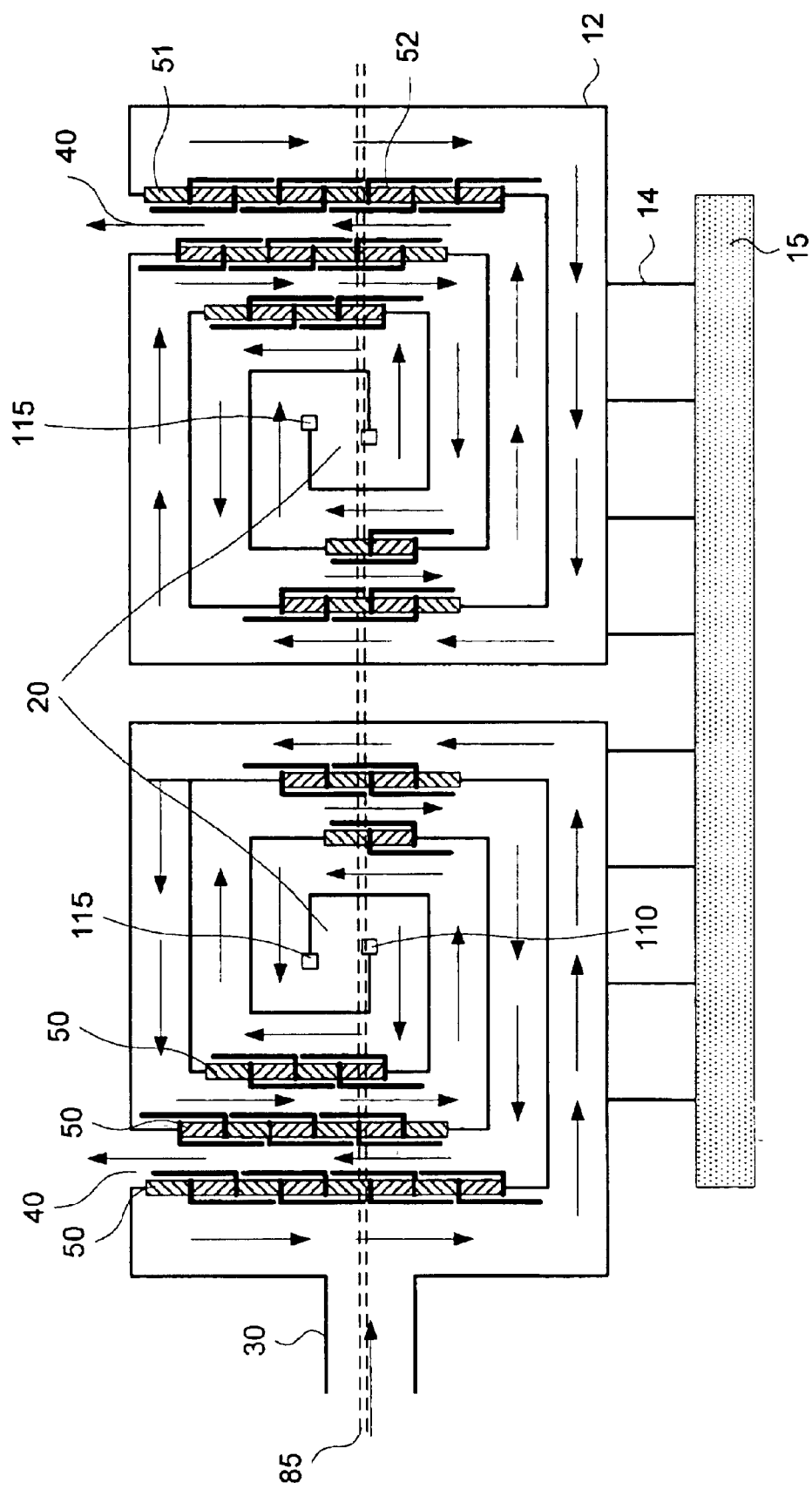
FIGS. 5 and 6 are cross sections of generators according to embodiments of the present invention.

According to another aspect of the present invention, a microgenerator is formed by including thermoelectric power generating elements as part or all of the heat exchanger walls to form a thermoelectric "active wall." Thermoelectric active walls 50, forming parts of the channel walls are included in the exemplary microgenerator cross sections of FIGS. 4a, 5, and 6. The thermoelectric active wall 50 shown in FIG. 4a would be positioned in the place of the portion of channel wall denoted by 60 in FIG. 1a to form a microgenerator. Thus, elements of vertically oriented active walls, where vertical is defined by the orientation shown in FIGS. 4a, 5, and 6, are cylindrical or semicylindrical in shape. With the present design, temperature sensitive thermoelectric materials can be used for thermoelectric elements by limiting the thermoelectric active wall to the cooler outermost channel wall, as shown in FIG. 4a, while allowing a high enough temperature for combustion in the central combustion region. In most cases, as in FIGS. 5 and 6, thermoelectric elements can be placed in multiple portions of the channel walls.

Figure 7:
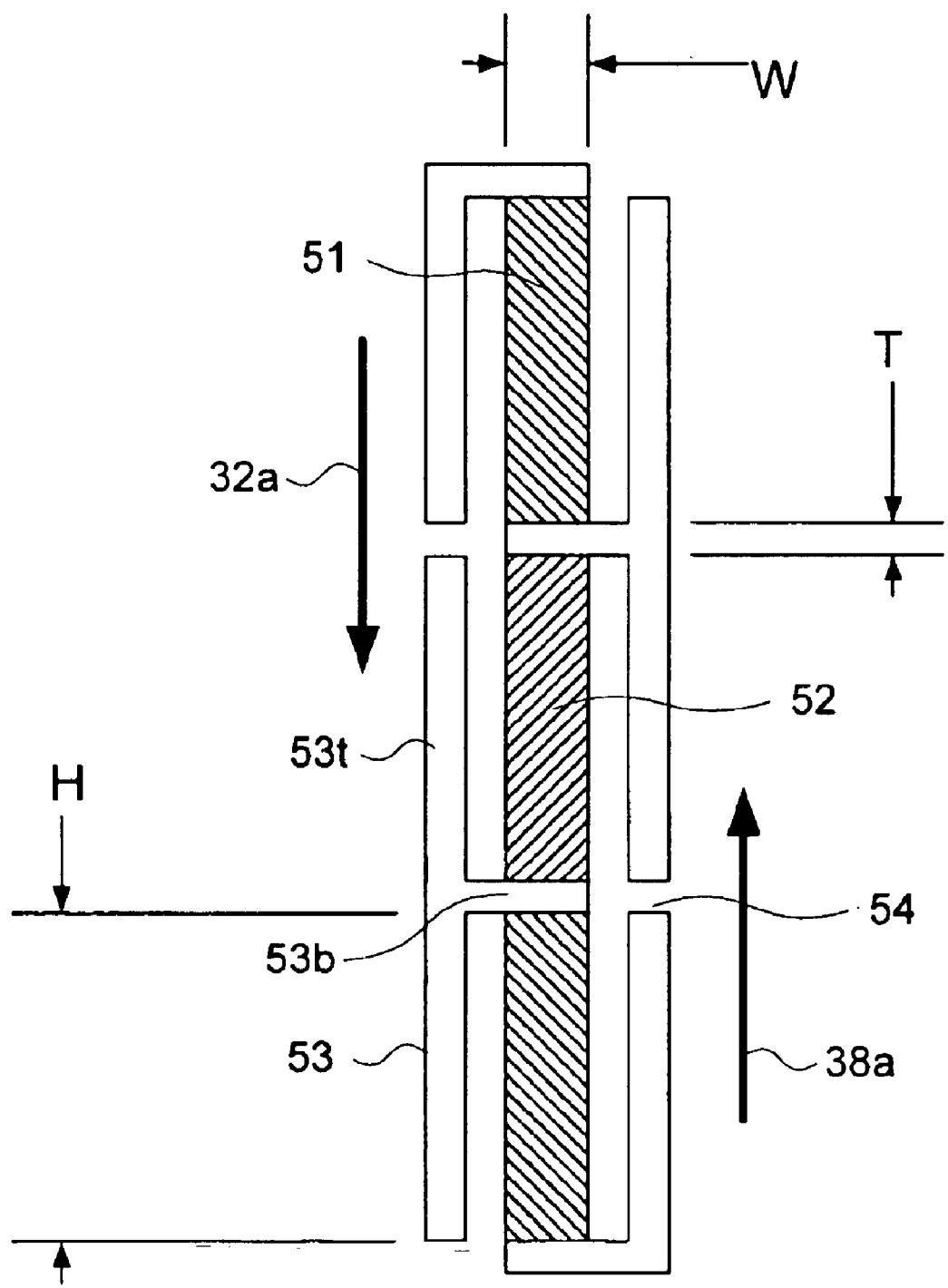
FIG. 7 is a cross section of a thermoelectric active wall with T-shaped fins included in generators according to embodiments of the present invention.

Because of the spiral heat exchanger design, one surface of the thermoelectric active wall is exposed to the flow of cool reactant gas, while the other surface is exposed to the flow of hot exhaust gas. A thermoelectric active wall, as shown in detail in FIG. 7 includes elements of n-type conductivity thermoelectric material 51, and elements of p-type conductivity thermoelectric material 52, separated by metal fins 53. Each active wall includes multiple series-connected pairs of n-type and p-type elements. The width of the thermoelectric elements is typically in the range of 10 to 100 μm. Preferably, thermoelectric materials that can be electrodeposited are used to form the thermoelectric elements. A binary bismuth telluride compound, in particular $Bi_2Te_3$ is a useful n-type material, while a ternary compound, written as $Bi_{2-x}Sb_xTe_3$ is a useful p-type material. Other useful thermoelectric materials include lead telluride, zinc antimonide, cobalt antimonide, and related ternary compounds.

The fins 53 are designed to increase the temperature differential across the thermoelectric elements relative to the temperature difference between the thermoelectric elements and the reactant and exhaust gases. The general T-shape of the metal fins shown in FIG. 7 was developed by Jean-Pierre Fleurial and Jeff Snyder, both of Jet Propulsion Laboratory. The T-shaped fins include a base portion 53b and a top portion 53t, substantially perpendicular to the base portion, with the base portion inserted between the thermoelectric elements and the top portion extending into the reactant channel on one side such that the reactants flow past the top portion in direction 32a. The top portion 53t of the T-shaped fins extends into the exhaust channel (right side of FIG. 7) such that exhaust gases flow past the top portion in direction 38a. The top portions are oriented in the flow channels substantially parallel to the flow directions 32a and 38a. The active wall configuration provides a means of connecting n-type and p-type thermoelectric elements in series with polarities properly aligned to provide an increase in voltage across each element and thus maximize the total voltage output of the device.

The fins included in the thermoelectric active wall serve several purposes. First, the base portions of the T-shaped metal fins act as a diffusion barrier between unlike thermoelectric materials to avoid degradation of the thermoelectric efficiency over time. Second, and principally, the fins are designed to increase the temperature differential across the thermoelectric elements relative to the temperature difference between the exhaust gas and the thermoelectric elements.

Maintaining a high temperature differential across the thermoelectric elements is important in integrating thermoelectric devices with microcombustion. According to an aspect of the present invention, the present inventors have determined that for optimal thermoelectric performance, the ratio of the height H of the thermoelectric elements along the channel wall, to the width, W, of the elements in the channel wall, should be larger than about 3:1. For example, a ratio of H:W of about 8:1 is expected to provide excellent thermoelectric performance. Because it is desirable that the fins be as large as possible without touching one another and shield the thermoelectric elements from direct contact with gas, the aspect ratio of the elements determines the aspect ratio of the T-shaped fins 53. The gap 54 between the fins should be small. Therefore, neglecting the gap, the total length of the top portion of the fins is approximately 2H, while the width of the base portion is on the order of 2W, where the space between the fin and the thermoelectric element is on the order of W. The desired ratio of length to width of the fins, therefore, is on the order of the ratio of H:W.

Without being bound to any theory of operation, the following explains the configuration considerations of the thermoelectric active wall in terms of conduction-dominated heat transfer. The problem in maintaining a high temperature differential ΔT across the thermoelectric elements arises because the thermal conductivity of the thermoelectric elements, $k_{TE}$, is typically about 1 watt per meter per degree Kelvin (W/mK), which is much higher than the thermal conductivity, $k_{gas}$, of the reactant and exhaust gases, which is typically on the order of 0.03 W/mK. For conduction-dominated heat transfer, characteristic of microscale devices operating at low Reynolds numbers, ΔT is proportional to the thermal resistance X/kA, where X is the conduction distance and A the area exposed to heat transfer. Consequently, $$\Delta T_{gas\text{-}fin}:\Delta T_{fin\text{-}TE}:\Delta T_{TE} \approx X_{as}/k_{gas}A_{fin}:X_{base}/k_{fin}A_{base}:X_{TE}/k_{TE}A_{TE}.$$

The conduction lengths are given by $X_{base} \sim W$ and $X_{TE} \sim H$ and the areas exposed to heat transfer are $A_{fin} \sim H$, $A_{base} \sim Y$, and $A_{TE} \sim W$. Since the metal fins typically have very high conductivity, about 20 to 100 W/mK, depending on the metal, $$k_{fin} \gg k_{TE} \gg k_{gas},$$

and thus $$\Delta T_{gas\text{-}fin}:\Delta T_{fin\text{-}TE}:\Delta T_{TE} \approx X_{gas}/k_{gas}H:0:H/k_{TE}W,$$

where conduction across the air gaps between fins has been neglected. Consequently, $\Delta T_{gas\text{-}fin}/\Delta T_{TE} \sim X_{gas}W/H^2$. Since a small value of $\Delta T_{gas\text{-}fin}/\Delta T_{TE}$, that is a small differential between the gas the thermoelectric elements relative to the differential across the thermoelectric elements, is desired, the active wall design is optimized by increasing the element height H, and decreasing the element thickness W. Hence a large ratio of H:W is beneficial.

Figure 8A:
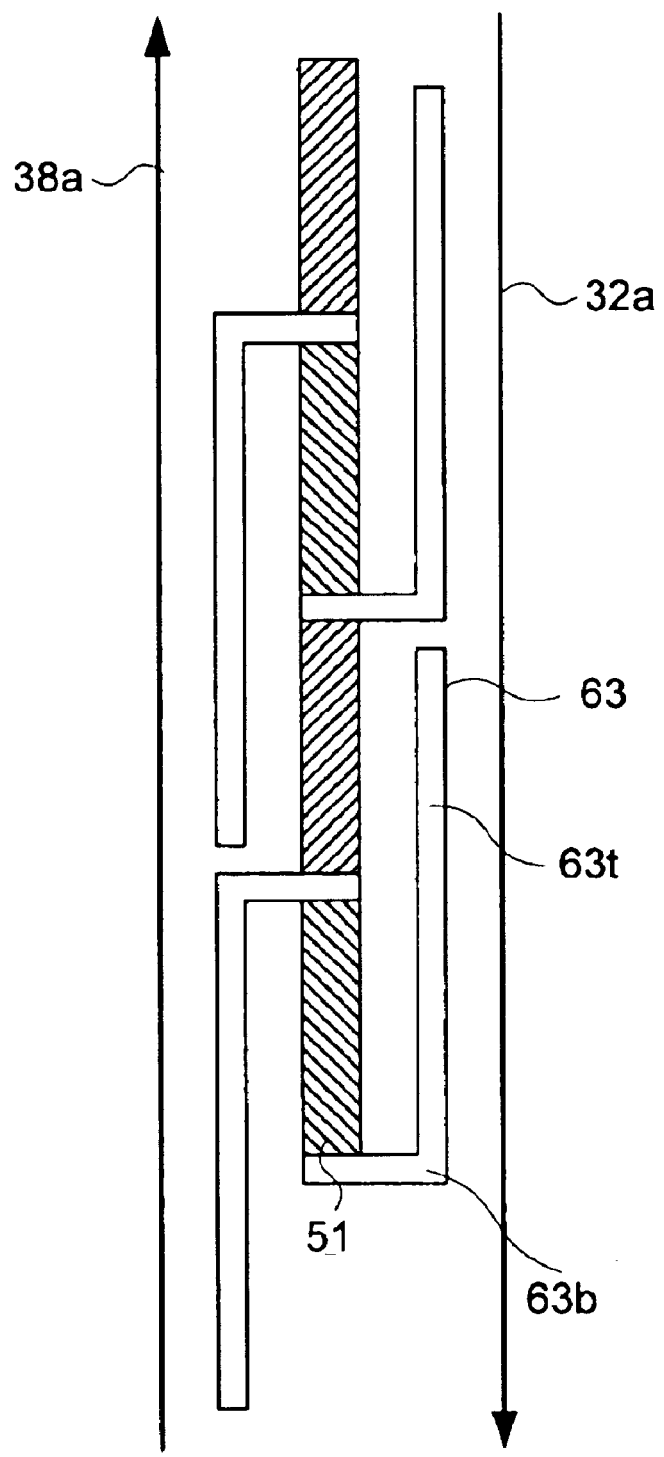
FIGS. 8a and 8b illustrate cross sections of L-shaped fins and asymmetric T-shaped fins, according to embodiments of the present invention.
Figure 8B:
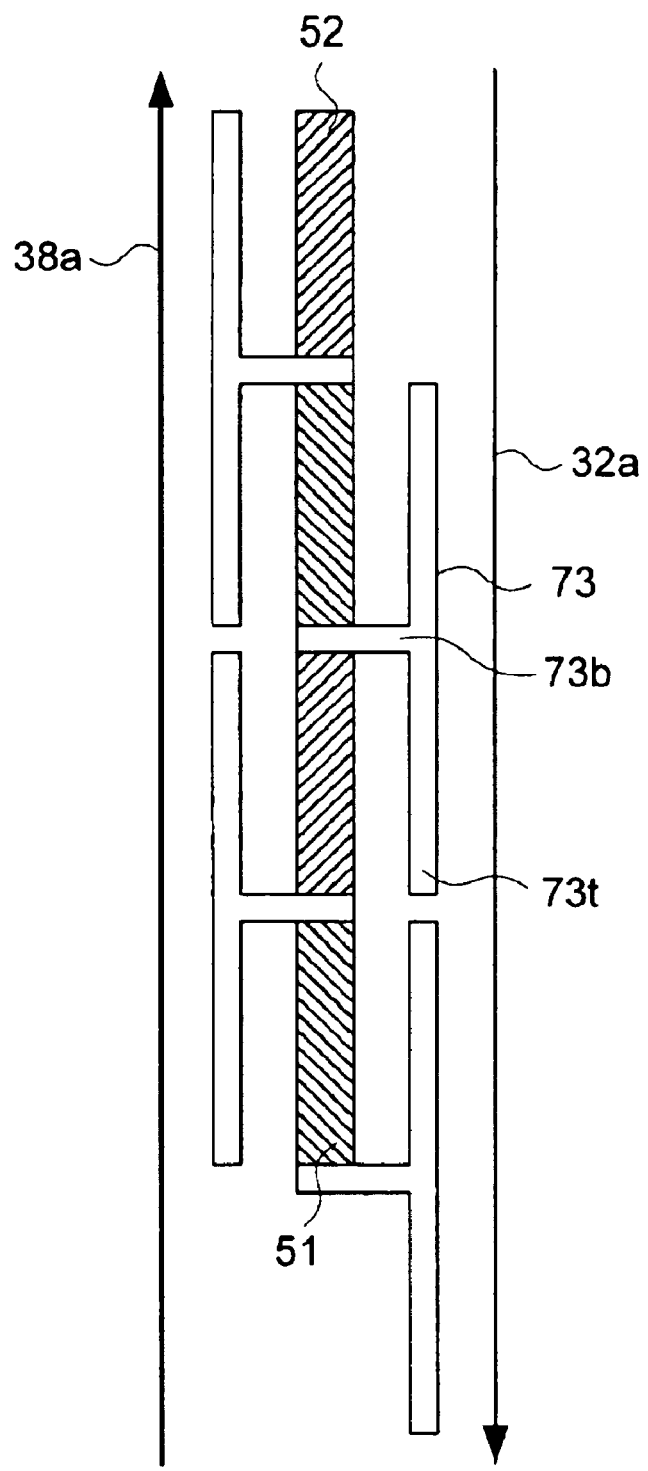

Alternative fin designs constitute additional aspects of the present invention. An alternative L-shaped fin 63, consisting of a base portion 63b and a top portion 63t, substantially perpendicular to the base portion, is illustrated in FIG. 8a. Fin 63 is oriented such that the top portion of the L extends from the base in the upstream direction on both sides of the channel wall. A hybrid fin 73 is shown in FIG. 8b. Hybrid fin 73 is an asymmetric T-shaped structure in which the part of the top portion 73t extending from the base 73b in the upstream direction is longer than the portion of the top extending in the downstream direction. The configuration of the L-shaped and hybrid fins is chosen to optimize the temperature gradient across the thermoelectric elements and hence provide optimal power and conversion efficiency. Any of the fin designs may optionally include projections on their top portions extending into the gas streams. The projections increase fin surface area, which increases heat transfer, but must be balanced however against influencing pressure and thus gas flow in the channels.

Figure 9:
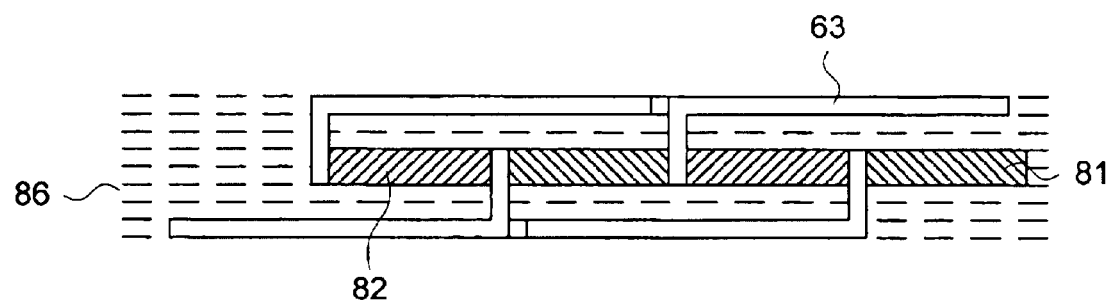
FIG. 9 illustrates a cross section of a thermoelectric active wall with staggered n-type and p-type elements according to embodiments of the present invention.

In the microgenerator configurations discussed to this point, the active walls 50 are oriented vertically. The fabrication technique preferably used to manufacture the microgenerator, discussed below, builds up the devices layer by layer. It is highly desirable to minimize the number of different materials that must be deposited on each layer, which leads to using thermoelectric material only on vertical walls assuming the layers are horizontal. If multiple vertical walls are used, the relative positions of n-type and p-type materials on each wall can be adjusted so each layer, for example layer 85 in FIGS. 5 and 6, contains only one type. However, including thermoelectric material on horizontal walls, in addition, would provide an opportunity to increase power and efficiency of the devices. Thermoelectric elements on horizontal active walls are washer or half-washer shaped. FIG. 9 illustrates an active wall provided with L-shaped fins and staggered n-type thermoelectric elements 81 and p-type thermoelectric elements 82. A staggered configuration is useful for horizontally oriented active walls in that on any layer, for example, layer 86, a maximum of one conductivity type of thermoelectric material needs to be deposited. Although L-shaped fins 63 are shown in FIG. 9, staggered walls can be used with any fin design. In the foregoing, the vertical direction was taken to be parallel to the axis of rotation of the toroid. The application of these considerations to fabrication of devices in other orientations will be understood by practitioners.

According to another aspect of the present invention, the thermoelectric material is a composite material including a second phase consisting of particles having low thermal conductivity (insulative). To provide the lowest thermal conductivity, the particles are hollow, enclosing a vacuum, or are gas-filled. Polymers, glass, or metal hollow microspheres form suitable low thermal conductivity particles. Alternatively, the particles can comprise aerogel-like materials. In all cases, the particle size should be considerably smaller than the minimum feature size of the thermoelectric elements. Typical particle sizes are less than about 5 $\mu$m. Due to the presence of the second phase, the thermoelectric elements have lower overall thermal conductivity which leads to a higher temperature differential $\Delta T_{TE}$ across the thermoelectric elements. As discussed previously, a high value of $\Delta T_{TE}$ is desirable. While including insulating particles in the thermoelectric material also lowers electrical conductivity, there is still a net benefit to using composite thermoelectric material.

The electrical interconnections of the microgenerator, including connections to the exterior of the device, take advantage of the generator being constructed of conducting material to avoid the need for additional conductors that would be difficult to integrate at a micro scale. Exemplary alternative electrical interconnection configurations are illustrated in FIGS. 4a, 5, and 6, each of which includes a negative terminal 110 and a positive terminal 115. Contact is made with the positive terminal 115 in FIG. 4a and with both terminals in FIG. 5 through an electrical conductor located in a partition wall 210. Contact can be made with the negative terminal 110 of FIG. 4a or with both terminals in FIG. 6 at virtually any location exposed on the outside of the generator. The positions of the terminals depend in part on the placement of the reactant gas port and the number of windings. The wiring configuration of FIG. 6 with both terminals on the outside of the generator is suitable for a full toroidal generator with no partition wall or for a device with a partition wall without electrical connections to the thermoelectric elements.

Figure 4B:
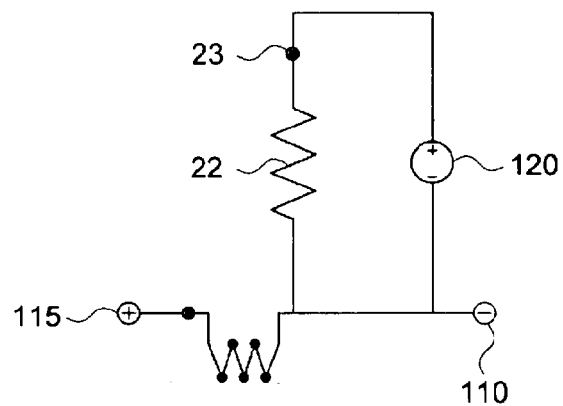

Wiring of the igniter utilizing the semiannular resistive material 22 in FIG. 4a also takes advantage of the conducting structural walls. As shown in the schematic diagram of FIG. 4b, an external power supply 120, which is illustrated as a DC power supply but may be a DC or AC supply, is connected to the thin layer of structural metal 23 where it contacts the partition wall. In this configuration, part of the structure of the generator serves both as a current path for power generation and for ignition.

The microgenerator cross section of FIG. 6 includes a bridge 125 which provides mechanical support to the structure. Bridge 125 is made of the electrically conducting structural material of the generator and thus also provides a needed electrical connection. Bridge 125 is porous or consists of individual slats in order to allow free passage of gases in the combustion chamber. Bridge elements can optionally be provided across channel walls to provide mechanical support. Bridge elements are made of conducting or insulating material depending on the wiring configuration with care being taken not to short out an electrical path using a conductive bridge in an inappropriate location.

The configurations of FIGS. 5 and 6 may include additional features to provide ignition. In one alternative, bridge 125 in FIG. 6 may be made of a very thin conductive material that is resistively heated to ignite combustion. In this approach, the microgenerator may also include a thicker bimetallic shunt (not shown) anchored on one wall 126 which bends due to the heat of combustion so as to make electrical contact with the other wall 127 to provide a lower resistance, electrically parallel path, than the thin wire bridge 125. The configuration of FIG. 5 could include a spark gap (not shown) between terminals 115 and 110 to which is applied a high voltage for ignition. Alternatively the structure may additionally include an externally powered bimetallic hot wire igniter connecting terminals 115 and 110. In this case, the hot wire bends away when it is heated by the combustion to break contact with either terminal 115 or 110, leaving the wiring configuration as shown in FIG. 5.

In a microgenerator composed of two or more partial toroidal portions separated by one or more insulating partition walls, each portion may be electrically independent. This arrangement enables the portions to be wired in series or in parallel to maximize current or voltage depending on the desired application.

In an alternative embodiment, a microgenerator consists of two half toroidal portions separated by a porous or perforated partition wall where one portion with no thermoelectric elements is used for combustion and the other portion including thermoelectric elements is used for generation. The portions are arranged such that the hot exhaust products from the combustor are directed across the thermoelectric elements in the generator portion.

Figure 10:
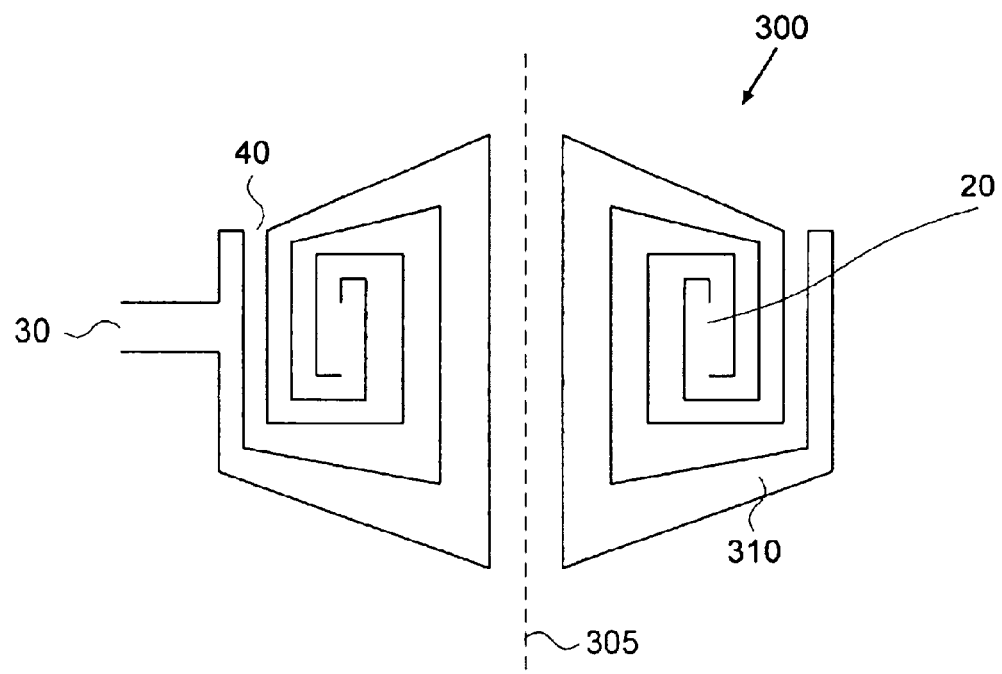
FIG. 10 illustrates a combustor with variable channel sizes according to yet another embodiment of the present invention.
Figure 11:
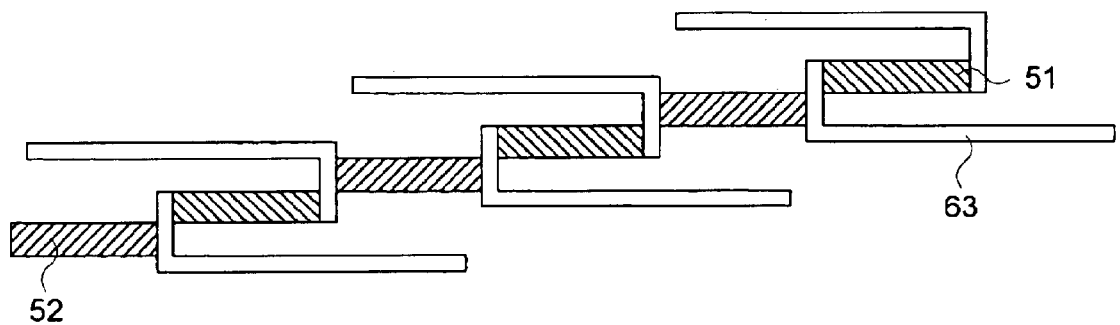
FIG. 11 illustrates a slanted thermoelectric active wall useful in a generator including the combustor of FIG. 10 according to an embodiment of the present invention.

In yet another embodiment, a combustor has a variable flow channel height. In a toroidal microcombustor, the dimension of a ring-shaped flow channel in the circumferential direction, hereinafter the "width," varies greatly as a function of radius. For example the width may be several times smaller for the vertical channel closest to the axis of rotation compared with the vertical channel furthest from this axis. Moreover, the width of horizontal flow channels varies continuously, being smaller at the end of channels toward the axis and larger at the end of the channels away from the axis. To compensate, a least partially, for the varying flow resistance produced by the variation in channel width, combustor 300, shown in FIG. 10 is configured so that the heights of the channels closer to the axis 305 are larger than the heights of the channels near the outside. For horizontal channels, the heights are tapered such that they are taller near the center as illustrated in FIG. 10. For thermoelectric active walls adjacent off-horizontal channels 310, when combustor 300 is a generator, the active walls can be designed in a stair-step configuration with n-type elements 51 and p-type elements 52 each in a separate layer, suitable for microfabrication, as shown in FIG. 11.

To obtain higher power levels than a single microgenerator can provide, multiple generators can be fabricated on a common substrate. The substrate may be provided with conductive traces, which allow a generator array to be configured electrically in series or in parallel to adjust the output current and voltage of the array.

The microdevices of the present invention are preferably manufactured in certain embodiments by an electrochemical fabrication process using pre-formed conformable masks to build up devices from thin layers of materials. The masks allow selective plating of structural materials (e.g. metals) and support, or sacrificial, materials. The sacrificial materials are deposited in the spaces between the structural elements, which may include metals and thermoelectric materials, and subsequently removed by etching, melting, or electrolytically dissolving.

A suitable electrochemical fabrication process for depositing a structural material and a sacrificial material is described in detail in U.S. Pat. No. 6,027,630 (hereafter '630) to Cohen, which is incorporated herein by reference. The method includes forming a layer by positioning a mask including a conformable elastomer against a substrate to electrodeposit a sacrificial material in unmasked areas, removing the mask and blanket electrodepositing the structural material over the deposited sacrificial material and the substrate, and planarizing the layer. The sacrificial material is then removed, e.g. chemically. Using pre-formed masks of suitable pattern, a device is monolithically built up layer by layer. A typical layer thickness is between about 2 and about 10 $\mu$m. Typically, the microgenerator is fabricated in an orientation such that with the deposition layers defining the horizontal direction, the axis of rotation of the toroid is in the vertical direction, although alternative orientations may be chosen. Fabricating the microgenerator in half toroidal or partial toroidal segments facilitates removal of the sacrificial material.

For the present microdevices, platinum is a useful electrodeposited structural metal while copper is a useful sacrificial material that can be selectively removed from a platinum structure, for example, by using an etchant containing ammonium hydroxide or sodium persulfate. An electrochemical bath for depositing platinum, manufactured by Electroplating Engineers of Japan Ltd. and distributed by Enthone-OMI as Platinart 100 is beneficially used to form low-stress platinum as the structural metal. Alternative structural metals include nickel, for portions of devices away from the combustion region, nickel coated with a thin layer of a corrosion resistant material such as platinum, ruthenium, rhenium, or rhodium. Alternative sacrificial materials include chromium, iron, and zinc.

A microcombustor, which can be constructed of a single structural metal, is fabricated using the method described in the '630 patent. To form a microgenerator including active walls composed of thermoelectric elements, layers containing at least three materials—structural metal, sacrificial material, and an n-type or p-type thermoelectric material—need to be deposited. According to another aspect of the present invention, electrodeposition of three materials in a single layer requires the use of two masks, one "standard" mask as described previously, and an "anodeless instant mask" (AIM) described here.

Figure 12A:
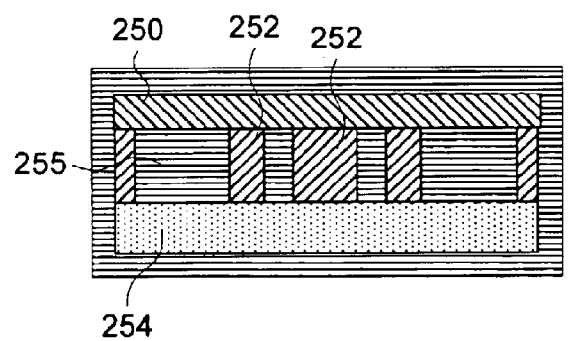
FIGS. 12a–12i illustrate a process of fabricating a generator according to embodiments of the present invention.
Figure 12B:
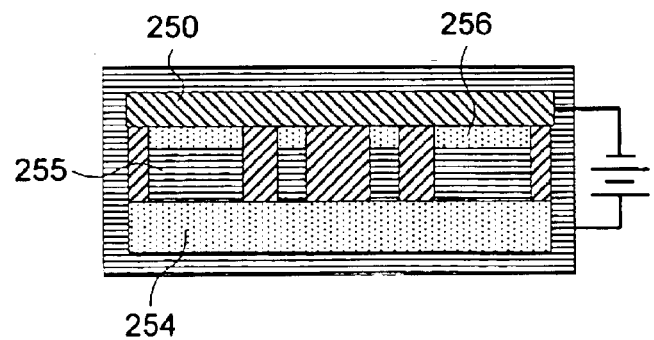
Figure 12C:
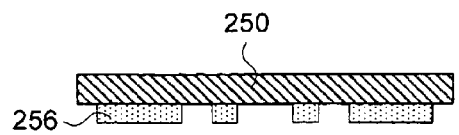

One process flow for the deposition of a layer including three materials using an AIM is illustrated in the cross sections of FIGS. 12a–12h, which depict a small portion of a microgenerator in the vicinity of one active wall. FIG. 12a includes a standard mask consisting of a patterned elastomer 252 attached to an anode 254 for depositing sacrificial material, pressed against a substrate 250. In the process flow diagrams, the substrate represents all previously deposited layers. The conformal elastomer 252 pressed against the substrate 250 prevents deposition in regions in which structural and thermoelectric material will be deposited in the subsequent steps. The sacrificial material 256, in FIG. 12b is deposited from the deposition bath 255, producing the pattern of deposited sacrificial material in FIG. 12c.

Figure 12D:
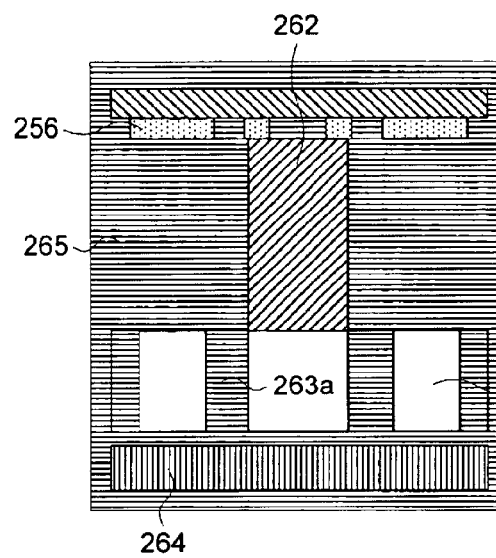
Figure 13:
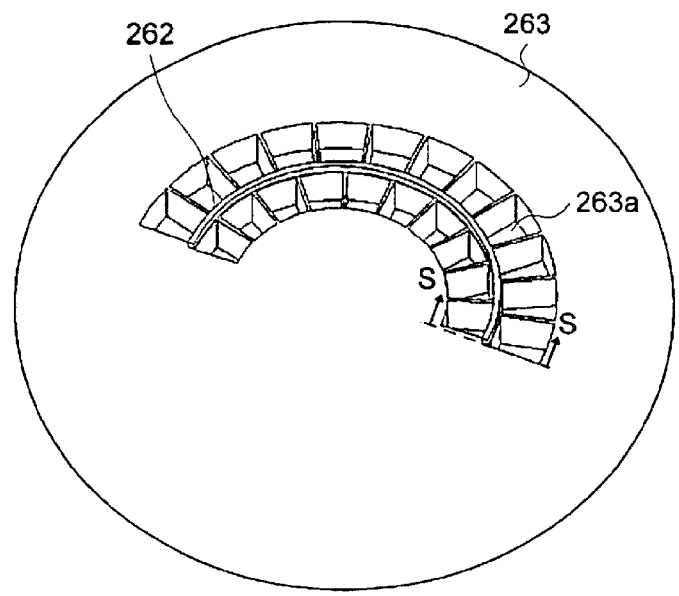
FIG. 13 is an anodeless instant mask used in the process of FIGS. 12a–12i.

Next, the structural metal is deposited using an anodeless instant mask. The AIM includes patterned elastomer 262 (see FIG. 12d) masking the position where the thermoelectric material is to be deposited in the next step. The patterned elastomer is attached to a non-electrode support 263 made of non-porous material, which may be perforated as shown. Perforations 263a can improve the uniformity of deposition into the substrate. Deposition bath 265 fills the space between the substrate and a separate anode 264, as shown in FIG. 12d, also filling the perforations of the AIM, if provided. A perforated AIM for fabrication of a half-toroidal part of a microgenerator is shown in a perspective view in FIG. 13. Such an AIM would be used in the fabrication of a microgenerator with only a single vertical active wall, while AIMs with multiple patterned elastomer rings would be used when multiple vertical active walls or a horizontal active wall with multiple thermoelectric element pairs is to be fabricated. The portion included in the cross section of FIG. 12d is indicated by the section lines S—S. Elastomer 262 is typically between about 20 and 150 $\mu$m in height and between about 10 and 100 $\mu$m in width. A characteristic dimension of perforations 263 is between about 10 and 200 $\mu$m.

Figure 12E:
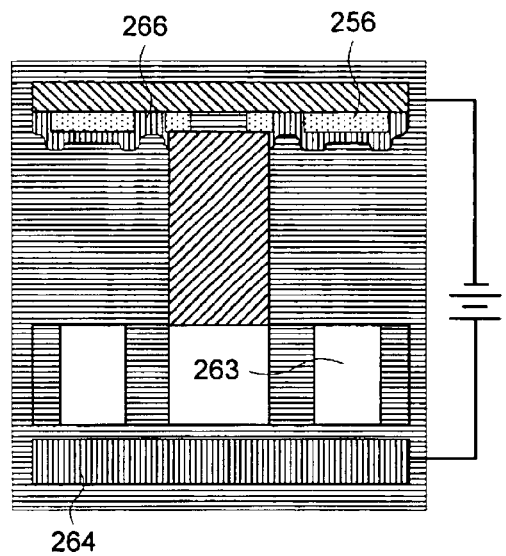
Figure 12F:
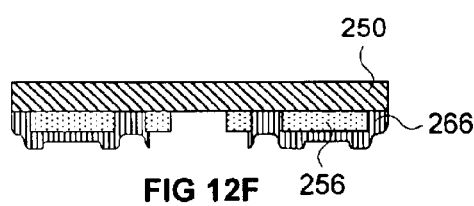
Figure 12G:
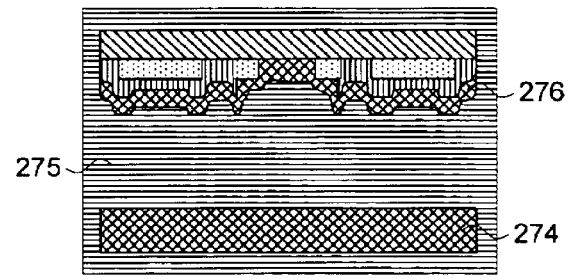
Figure 12H:
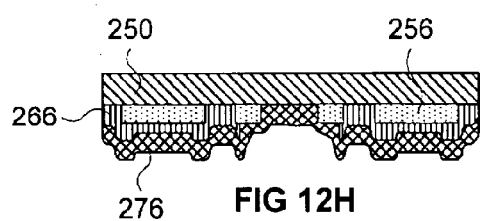
Figure 12I:
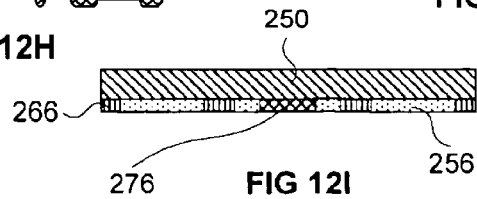

Returning to the process flow, the structural material is plated through the AIM as shown in FIG. 12e, depositing everywhere on the surface except in the central region protected by the elastomer 262 to produce the structure of FIG. 12f including sacrificial material 256 and structural material 266. Finally, the thermoelectric material is blanket deposited without use of a mask over the entire structure of FIG. 12f from deposition bath 275 using anode 274, in FIG. 12g, to produce the pattern of FIG. 12h. Depending on the particular layer, either an n-type or p-type thermoelectric material would be deposited, and preferably not both, which would required additional masking steps. Planarization then removes the excess structural and thermoelectric material to produce the layer of FIG. 12i including sacrificial material 256, structural material 266, and thermoelectric material 276. Planarization methods include lapping, polishing, and chemical mechanical polishing.

Alternatively, the order in which the three materials are deposited can be altered. For example, in an alternative process, a sacrificial material is deposited using a standard mask, followed by the deposition of a thermoelectric material through an AIM mask patterned to cover the position occupied by the structural metal, followed by blanket deposition of the thermoelectric material. Additional permutations of the order in which the materials are electrodeposited may also be used.

To fabricate the configuration including an igniter of semiannular resistive material 22 as in FIG. 4a, the processes described above may be combined with semiconductor fabrication processes. For example, after an appropriate number of layers have been electrodeposited, a portion of the deposited material is selectively etched away using patterned photoresist to define an etched cavity. The resistive material is deposited into the etched cavity, optionally planarized, and optionally coated with a conductive plating base. The layer by layer electrodeposition process is then resumed.

Composite thermoelectric materials may be used in all of the fabrication processes described here. To produce composite thermoelectric materials, low conductivity particles of the second phase may be co-deposited during electrodeposition of the thermoelectric material.

The AIM may be fabricated based on a silicon wafer using methods and materials described in the '630 patent together with conventional methods from semiconductor fabrication. An elastomer mold is formed, for example by patterning resist on a substrate, treating the resist with mold release and then coating with liquid elastomer. A silicon wafer is pressed against the elastomer covered mold, the elastomer is cured to solidify it, and the silicon wafer with attached molded elastomer separated to form patterned elastomer feature 262. Residual elastomer remaining after molding can be removed with reactive ion etching or other means to expose the silicon surface except where covered by the elastomer feature. The perforations 263a in support 263 can be formed, if desired, for example, using photoresist patterned over elastomer and silicon and reactive ion etching, followed by stripping of the photoresist.

Figure 14C:
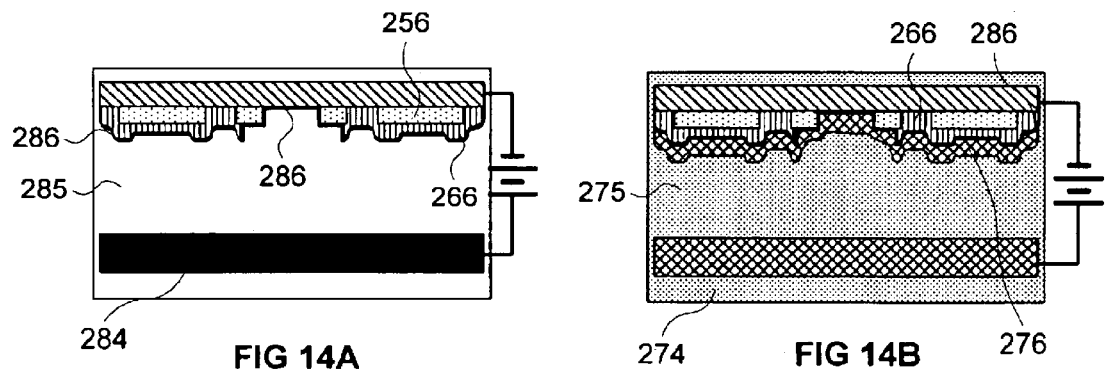
Figure 14C:
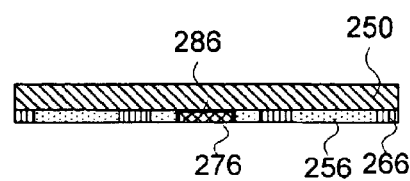
Figure 15A:
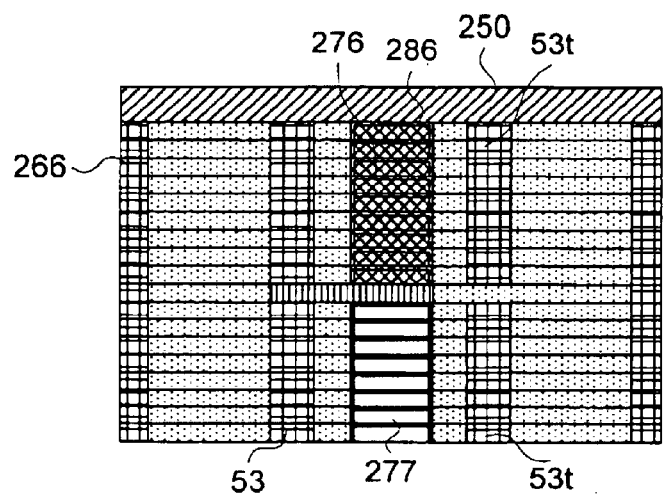
FIGS. 15a and 15b illustrate additional process steps in fabricating a generator including a barrier layer in the thermoelectric elements.
Figure 15B:
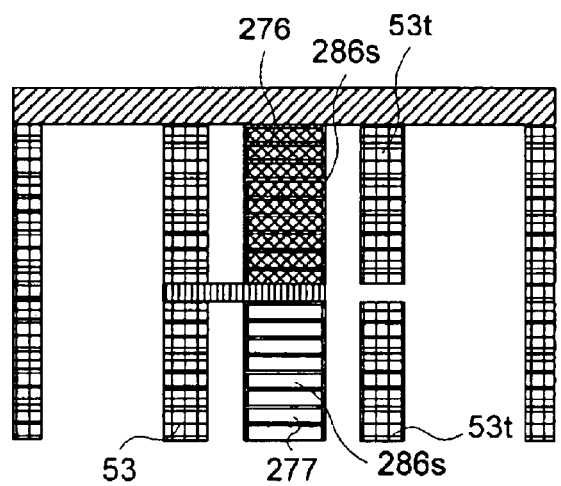
Figure 15C:
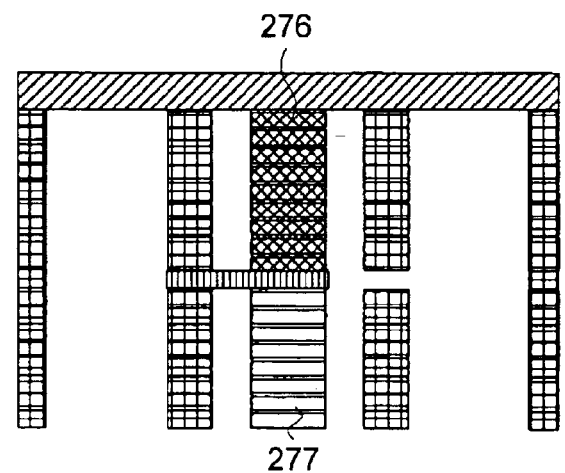
FIG. 15c is a cross-section of a portion of a generator including a barrier layer in the thermoelectric elements according to an embodiment of the present invention.

According to yet another aspect of the present invention, to form a microgenerator, each deposition of thermoelectric material is preceded by deposition of a thin barrier layer. The barrier layer is useful to overcome any incompatibility between the sacrificial material and the thermoelectric material. Useful barrier materials include gold, platinum, and nickel. In the process flow using a barrier layer, the sacrificial material and structural metal are deposited as discussed previously with respect to FIGS. 12a–12f. Next, a thin barrier layer is blanket deposited from deposition bath 285 and anode 284 to form thin barrier layer 286, as shown in FIG. 14a. The layer of thermoelectric material is deposited on the thin barrier layer as described previously and the resulting layer planarized, as shown in FIGS. 14b and 14c. Multiple repetitions of the entire process flow, results in the structure illustrated in FIG. 15a, in which each thermoelectric layer is separated from the next layer of thermoelectric material by a barrier layer 286 and the sides 286s of the multi-layer thermoelectric element are also coated with the barrier layer. FIG. 15a includes thermoelectric material of two conductivity types, 276 and 277. The layers of structural material constitute a recognizable part of a T-shaped fin 53, shown to the left of the thermoelectric material, and parts of the top portions 53t separated by a gap, shown on the right of the thermoelectric material. The structure after etching of the sacrificial material is illustrated in FIG. 15b. Finally, the barrier layer material on the outside of the thermoelectric material 286s, exposed to open space in the device, is etched away to prevent electrical shorting of the thermoelectric elements, as shown in FIG. 15c.

Although the present invention has been described in terms of specific materials and structures, the description is only an example of the invention's application. Various adaptations and modifications of the structures and processes disclosed are contemplated within the scope of the invention as defined by the following claims.

We claim:

1. A microscale combustor comprising:

a counterflow heat exchanger having a generally toroidal exterior surface, and defining an interior central for combustion with openings to a reactant gas channel and an exhaust gas channel and wherein the reactant channel and exhaust channel are coiled around each other and separated by a channel wall, wherein an internal dimension of the central region is smaller than about 1 millimeter;

a reactant gas inlet on the exterior surface of the heat exchanger in communication with the reactant gas channel; and an exhaust gas port on the exterior surface of the heat exchanger in communication with the exhaust gas channel.

2. The combustor of claim 1 further comprising an igniter within the central region.

3. The combustor of claim 1 wherein the width of the reactant channel and the width of the exhaust channel vary with radius from the axis of rotation of the toroidal surface.

* * * * *